United States Patent [19]

Case et al.

[11] Patent Number: 4,818,357
[45] Date of Patent: Apr. 4, 1989

[54] METHOD AND APPARATUS FOR SPUTTER DEPOSITION OF A SEMICONDUCTOR HOMOJUNCTION AND SEMICONDUCTOR HOMOJUNCTION PRODUCTS CREATED BY SAME

[75] Inventors: Christopher Case; Joseph J. Loferski, both of Providence, R.I.; Francisco Sanchez-Quesada, Madrid, Spain

[73] Assignee: Brown University Research Foundation, Providence, R.I.

[21] Appl. No.: 47,414

[22] Filed: May 6, 1987

[51] Int. Cl.[4] .................. C23C 14/54; C23C 14/56
[52] U.S. Cl. .................... 204/192.25; 204/298
[58] Field of Search .............. 204/192.15, 192.25, 204/298

[56] References Cited

U.S. PATENT DOCUMENTS

| | | | |
|---|---|---|---|
| 4,057,476 | 11/1977 | Krikorian et al. | 204/192.11 X |
| 4,283,260 | 8/1981 | Thomas et al. | 204/192.15 X |
| 4,417,092 | 11/1983 | Moustakas et al. | 204/192.25 X |
| 4,465,575 | 8/1984 | Love et al. | 204/192.25 X |
| 4,647,338 | 3/1987 | Visser | 204/298 X |

FOREIGN PATENT DOCUMENTS 0191096 9/1985 Japan ...................... 204/192.1

Primary Examiner—Donald R. Valentine
Attorney, Agent, or Firm—Joseph S. Iandiorio; Brian M. Dingman

[57] ABSTRACT

A vacuum chamber is provided for sputter deposition of a semiconductor homojunction. A target made of a semiconductor compound containing at least one non-metallic element is provided. A substrate for receiving the sputtered species from the target to form sequential layers of deposited semiconductor material is also provided. An electric field is provided between the target and the substrate. An inert gas is introduced sequentially at a plurality of discrete partial pressures to adjust the incident energy of the sputtered species by thermalization, for altering the mean free path of the sputtered and incident species to control the ratio of non-metallic to metallic elements in the deposited semiconductor material and create a plurality of different semiconductor material layers.

48 Claims, 7 Drawing Sheets

| SEMICONDUCTOR COMPOUND | TYPICAL GROUP STRUCTURE |
| --- | --- |
| Binary | $II-VI_2$ , $III-V$ |
| Ternary | $I-III-VI_2$ |
| Quaternary | $I-III_{1-x}-III_x-VI_2$ |
| Petenary | $I-III_{1-x}-III_x-VI_{1-y}-VI_y$ |

Fig. 9

| GROUP | TYPICAL ELEMENT |
| --- | --- |
| I | Cu |
| II | Cd |
| III | Al, Ga, In |
| IV | Si, Ge |
| V | As |
| VI | Se, Te, Se |

Fig. 10

METHOD AND APPARATUS FOR SPUTTER DEPOSITION OF A SEMICONDUCTOR HOMOJUNCTION AND SEMICONDUCTOR HOMOJUNCTION PRODUCTS CREATED BY SAME

FIELD OF INVENTION

This invention relates to a method and apparatus for sputter deposition of a semiconductor homojunction and the resulting semiconductor homojunction product and more particularly to a method and apparatus for producing a thin-film solar cell from a direct bandgap photovoltaically active semiconductor material.

BACKGROUND OF INVENTION

Conventional techniques for producing photovoltaically active semiconductors (PVAS) for use in solar cells are normally costly, complex or dangerous. In addition, many conventional solar cells are fabricated with a relatively thick PVAS, much of which is not actually active in the photovoltaic process. As a result, the cost of producing solar cells has not been reduced to a level which can make them a competitive alternative to nuclear or fossil fuel for producing electricity.

The most popular commercial solar cell is the single crystalline silicon cell. This type of cell utilizes a silicon material that is relatively expensive to produce. However, because of the brittle nature of the silicon it is difficult to produce slices of this material less than twenty thousandths of an inch thick. Therefore, in use in the solar cell 99.9% of this expensive material acts as a substrate, and only the top 0.1% of the wafer is actually utilized as a PVAS. Even this 0.1% layer is relatively thick because the single crystal silicon is an indirect bandgap semiconductor, which requires a thickness of up to one hundred times more than a comparable direct bandgap semiconductor to absorb an equal number of incident photons.

In order to reduce the cost of solar cells, the use of direct bandgap PVAS materials has been widely studied. Many of these direct bandgap materials can be utilized to fabricate a relatively efficient solar cell with a total thickness of the PVAS of only on to two microns. This extremely thin material can be deposited on a suitable substrate, which provides rigidity and flatness, to produce a low-cost thin-film solar cell.

There are several techniques for producing thin-film solar cells, many of which exhibit cost or scale-up problems. Flash evaporation is not suitable for large area deposition and is very material inefficient. Chemical spray pyrolysis is not applicable to all materials and results in low quality films Multi-source evaporation is expensive and not suitable for large area coverage. Molecular beam epitaxy is an extremely expensive deposition technique. In contrast, sputtering is a very inexpensive technique for large area deposition of a thin-film PVAS.

In addition to the problems associated with production techniques, there are also problems associated with many of the materials which are suitable for use as thin-film solar cells. Amorphous silicon is easy and inexpensive to deposit but has reduced efficiency and problems with long-term stability. Copper sulfide is also a relatively unstable compound. Gallium arsenide is difficult and expensive to produce in the required single crystalline form. In contrast, copper indium selenide is an excellent solar cell material because cells made from it are very stable, it is a direct bandgap material, has a higher absorption coefficient than most direct bandgap materials and operates effectively in polycrystalline form.

As a result of the above constraints, sputtering of copper indium selenide has been studied as a promising method of manufacturing thin-film solar cells. Conventional sputtered copper indium selenide solar cells are made by sputtering a p type layer of copper indium selenide and then depositing an n type layer of another compound, typically cadmium sulfide, on the surface of the copper indium selenide. This technique produces an efficient solar cell heterojunction, but exhibits two substantial problems. First, the copper indium selenide is generally produced using a reactive selenide gas and sputtering only the copper and indium because of the difficulties of sputtering a ternary compound. This reactive sputtering technique typically uses hydrogen selenide as the reactive gas. Hydrogen selenide is an extremely toxic, odorless and colorless gas which can only be used with expensive containment chambers and safety apparatus. Thus, this reactive sputtering system is inappropriate for high-volume production of solar cells.

The second problem associated with traditional methods of producing these thin-film heterojunctions is that two separate deposition systems are required to deposit the two different semiconductor compounds. The p type copper indium selenide is produced first in a sputtering chamber. The n type cadmium sulfide layer is usually then deposited in an independent evaporative vacuum system. It has been shown that losses in efficiency occur due to exposure of the surface of the copper indium selenide, which forms the heterojunction, to air during transfer to the cadmium sulfide production chamber. Thus, the two systems required to produce this p/n heterojunction are expensive and may result in a thin-film solar cell with reduced efficiency.

A single sputter deposition system using only one PVAS compound to produce a thin-film homojunction would thus seem to be the ideal method of fabricating a solar cell. Conventional techniques for sputter deposition of thin-film homojunctions, such as U.S. Pat. No. 4,057,476, vary the carrier type of the deposited film layers by varying only substrate temperature, film growth rate, or a bias voltage applied to the substrate. Because of the problems associated with sputter deposition of copper indium selenide, these conventional sputtering techniques use other compounds, such as Lead Tin Telluride, which may not be PVASs and thus may not possess the advantages of copper indium selenide. Thus, it is highly desirable to develop a simple and inexpensive technique for sputter deposition of copper indium selenide to form a PVAS homojunction for use in solar cell technology.

Once developed, this sputter deposition method can be used to produce a variety of semiconductor homojunction products by taking advantage of the relative ease and low cost of using sputtering to deposit semiconductor materials, as opposed to the other deposition techniques discussed above. Thus, semiconductor products with two or more layers, and made with one or more semiconductor materials, may be readily fabricated. These structures may include, for instance: transistor devices, high-efficiency multiple-layer sequential homojunction solar cells, radiation detection devices, light-emitting diodes, and, of course, thin-film solar cells.

SUMMARY OF INVENTION

It is therefore an object of this invention to provide a method of fabricating semiconductor homojunctions which is simple, effective and safe.

It is a further object of this invention to provide a method of fabricating semiconductor homojunctions which requires only one deposition system.

It is a further object of this invention to provide a method of fabricating semiconductor homojunctions which uses only sputtering techniques.

It is a further object of this invention to provide a method of fabricating semiconductor homojunctions which produces a relatively inexpensive solar cell.

It is a further object of this invention to provide a method of fabricating semiconductor homojunctions in which the partial pressure of an inert gas can be varied to alter the conductivity type and resistivity of the deposited semiconductor material.

It is a further object of this invention to provide a method of fabricating thin-film semiconductor homojunctions for use as solar cells.

It is a further object of this invention to provide a method of fabricating multiple layer sequential smiconductor homojunction structures.

It is a further object of this invention to provide a method of fabricating semiconductor homojunctions which can be used as light emitting diodes.

It is a further object of this invention to provide a method of fabricating thin-film semiconductor homojunctions from direct bandgap PVAS compounds.

It is a further object of this invention to provide a method of fabricating thin-film copper indium selenide homojunctions for use as solar cells.

It is a further object of this invention to provide a method of fabricating sequential semiconductor homojunction pair transistors.

It is a further object of this invention to provide a method of fabricating semiconductor homojunctions which can be used to produce binary, ternary, quaternary or pentenary semiconductor homojunctions.

It is a further object of this invention to provide a method of fabricating semiconductor homojunctions which uses only one sputtering system and can produce a multiple layer semiconductor with layers of varying thickness, conductivity type resistivity, and/or semiconductor compound type.

It is a further object of this invention to provide a method of fabricating semiconductor homojunctions which can be easily scaled up for commercial production.

It is a further object of this invention to provide a method of fabricating semiconductor homojunctions which produces an extremely stable homojunction.

It is a further object of this invention to provide a method of fabricating semiconductor homojunctions which uses an inexpensive and effective substrate material.

It is a further object of this invention to provide a vacuum chamber for sputter deposition of a semiconductor homojunction.

It is a further object of this invention to provide a vacuum chamber for sputter deposition of a semiconductor homojunction in which the partial pressure of an inert gas can be varied to alter the conductivity type and resistivity of the deposited semiconductor material.

It is a further object of this invention to provide a vacuum chamber for sputter deposition of a thin-film copper indium selenide homojunction.

This invention results from the realization that solar cells may be improved considerably by employing a sputter deposition system to deposit an extremely thin film homojunction. This invention results more generally from the further realization that semiconductor layers with varying conductivity type and resistivity can be deposited in a single sputter deposition system by varying the partial pressure of the inert gas used in the sputtering system.

This invention features a method of vacuum chamber sputter deposition of a semiconductor homojunction including providing a target made of a semiconductor compound containing at least one non-metallic element, providing a substrate for receiving the sputtered species from the target to form sequential layers of deposited semiconductor material, and providing an electric field between the target and the substrate. An inert gas is introduced sequentially at a plurality of discrete partial pressures to adjust the incident energy of the sputtered species by thermalization, for altering the mean free path of the sputtered and incident species to control the ratio of non-metallic to metallic elements in the deposited semiconductor material and create a plurality of different semiconductor material layers.

In a preferred method, the substrate is heated to 450 degrees Centigrade ±20 degrees Centigrade. The target is cooled to 50 degrees Centigrade or less. The electric field has a power density of between 1 and 8 Watts per square centimeter of target area.

The target may be made of copper indium selenide. Alternatively, the target may be made of a semiconductor compound containing at least one non-metallic element which is binary, ternary, quaternary, or pentenary. The semiconductor compound may be a direct bandgap compound. The inert gas may be argon. The argon may be first introduced at a partial pressure of approximately 3 Pascal to create a p type layer and second introduced at a partial pressure of approximately 2.25 Pascal to create an n type layer. Alternatively, the argon may be first introduced at a partial pressure of approximately 2.25 Pascal to create an n type layer and second introduced at a partial pressure of approximately 3 Pascal to create a p type layer.

The argon may be introduced at partial pressures of between approximately one and five Pascal to alter the conductivity type and resistivity of the plurality of different semiconductor material layers deposited on the substrate. The partial pressures of the inert gas may be sequentially varied to produce a plurality of homojunctions including: p/n; n/p; p/n/n+; n+/n/p; p+/p/n; n/p/p+; p+/p/n/n+; and n+/n/p/p+ type layers. Preferably, the partial pressure of argon employed to create the p type layers of copper indium selenide is approximately 3 Pascal and the partial pressure of argon employed to create the n type layers of copper indium selenide is approximately 2.25 Pascal. The partial pressure of argon employed to create the p+ and n+ type layers of copper indium selenide is preferably between one and five Pascal.

This invention also features a method of vacuum chamber sputter deposition of a two layer p/n copper indium selenide homojunction including providinga target cooled to 50 degrees Centigrade or less and made of copper indium selenide. A substrate kept at 450 degrees Centigrade ±20 degrees Centigrade for receiving the sputtered species from the target to form two layers of deposited semiconductor material is also provided. There is an electric field at a power density of between 1 and 8 Watts per square centimeter of target area provided between the target and the substrate. Argon gas is introduced at a first partial pressure of between 1 and 5 Pascal to adjust the incident energy of the sputtered species by thermalization, for altering the mean free path of the sputtered and incident species to control the ratio of non-metallic to metallic elements in the deposited material and create a p type semiconductor layer. Argon is then introduced at a second partial pressure of between 1 and 5 Pascal to create an n type semiconductor layer to create a p/n copper indium selenide homojunction. The first partial pressure of argon may be approximately 3 Pascal and the second partial pressure may be approximately 2.25 Pascal.

The disclosed method may also include introducing the argon at a first partial pressure to create a p+ type semiconductor layer, then introducing the argon at a second partial pressure to create a p type semiconductor layer, then introducing the argon at a third partial pressure to create an n type semiconductor layer and then introducing the argon at a fourth partial pressure to create an n+ type semiconductor layer to create a p+/p/n/n+ copper indium selenide homojunction. In the disclosed method, the four partial pressures may be between 1 and 5 Pascal. Preferably, the second partial pressure is approximately 3 Pascal and the third partial pressure is approximately 2.25 Pascal.

In another alternative preferred method, the inert gas may be sequentially introduced at three partial pressures of between one and five Pascal to deposit a three layer sequential semiconductor homojunction pair transistor. The substrate may be heated to 450 degrees Centigrade ±20 degrees Centigrade. The target may be cooled to 50 degrees Centigrade or less. The semiconductor compound may be copper indium selenide and the inert gas may be argon. The power density of the electric field may be between 1 and 8 Watts per square centimeter of target area. The first and third partial pressures may be approximately equal, to make the first and third deposited layers the same conductivity type. The second partial pressure may be different, to make the second deposited layer a different conductivity type than the other layers. In this method, a pressure of approximately 3 Pascal may be employed to create p-type layers and a pressure of approximately 2.25 Pascal may be employed to create n-type layers, to create p/n and n/p, and n/p and p/n, sequential homojunction pairs to create p/n/p and n/p/n transistors.

The preferred method may also be employed to deposit multiple sequential semiconductor layers which may be homojunctions. This method may include providing a plurality of targets, each made of a different semiconductor compound which may be a direct bandgap compound containing at least one non-metallic element, and providing a substrate for receiving the sputtered species from the target and an electric field between each target and the substrate. By providing means for sequentially selecting each of the targets and the associated electric field and introducing an inert gas sequentially at a number of discrete partial pressures, multiple layers of semiconductor compounds may sequentially be deposited on the substrate. Each layer may be a homojunction or may be a semiconductor compound layer.

This invention also features a vacuum chamber for sputter deposition of a semiconductor homojunction including a vacuum chamber, a cathode in the vacuum chamber for holding a target made of a semiconductor compound containing at least one non-metallic element, and an anode in the vacuum chamber for holding a substrate for receiving the sputtered species from the target to form sequential layers of deposited semiconductor material. A power supply is electrically connected between the anode and the cathode to create an electric field to form inert gas ions. Also included are means for introducing an inert gas into the vacuum chamber sequentially at a plurality of discrete partial pressures to adjust the incident energy of the sputtered species by thermalization, for altering the mean free path of the sputtered and incident species to control the ratio of non-metallic to metallic elements in the deposited semiconductor material and create a plurality of different semiconductor material layers.

In a preferred embodiment, the means for introducing the inert gas may include a perforated tubular member for introducing the inert gas circumferentially around the cathode. There may also be anode heating means for heating the substrate to approximately 450 degrees Centigrade and anode cooling means for maintaining the temperature of the substrate at approximately 450 degrees Centigrade ±20 Centigrade. In addition, there may be may be cathode cooling means for maintaining the target at 50 degrees Centigrade or less. In this preferred embodiment, the semiconductor compound may be copper indium selenide and the inert gas may be argon. The power density of the electric field between the anode and cathode may be between 1 and 8 Watts per square centimeter of target area.

The means for introducing the argon may include means for providing it sequentially at partial pressures of between approximately 1 and 5 Pascal to alter the conductivity type and resistivity of the plurality of different semiconductor material layers formed on the substrate from the sputtered species.

In an alternative preferred embodiment, the means for introducing may include means for providing the argon first at a first partial pressure of approximately 3 Pascal to create a p type copper indium selenide layer and second at a second partial pressure of approximately 2.25 Pascal to create an n type copper indium selenide layer. Alternatively, the means for introducing may include means for providing the argon first at a first partial pressure of approximately 2.25 Pascal to create an n type copper indium selenide layer and second at a second partial pressure of approximately 3 Pascal to create a p type copper indium selenide layer.

DESCRIPTION OF PREFERRED EMBODIMENT

Other objects, features and advantages will occur from the following description of a preferredembodiment and the accompanying drawings, in which:

FIG. 9 is a chart disclosing some of the typical group structures associated with the various types of sputtered semiconductor compounds according to this invention;

FIG. 10 is a chart disclosing some of the elements that fall into the groups of FIG. 9 and can be used as semiconductor materials in the production of homojunctions;

Figure 1:
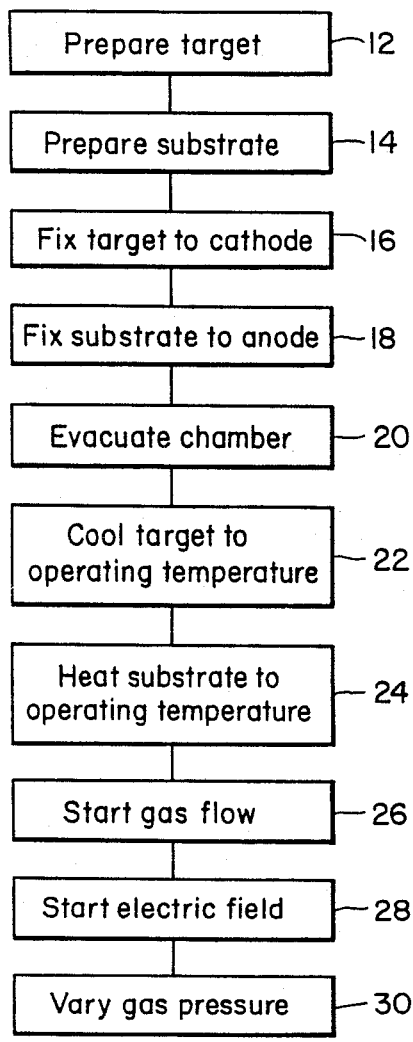
FIG. 1 is a block diagram of a method of vacuum chamber sputter deposition of a semiconductor homojunction according to this invention.

A method for vacuum chamber sputter deposition of a semiconductor homojunction may be accomplished using a vacuum chamber for enclosing an inert gas, providing a target made of a semiconductor compound containing at least one non-metallic element, a substrate for receiving the sputtered species from the target, and an electric field between the target and the substrate. The conductivity type and resistivity of the deposited semiconductor material layer can be varied by altering the partial pressure of the inert gas in the vacuum chamber. The method and apparatus is particularly suited for sputter deposition of direct bandgap semiconductor compounds, especially copper indium selenide. By varying the partial pressure of an inert gas such as argon, and keeping the rest of the vacuum chamber parameters constant, the conductivity type and resistivity of the deposited copper indium selenide layer can be closely controlled.

The inert gas is preferably introduced into the vacuum chamber at a first partial pressure, typically approximately three Pascal, to create a p type semiconductor layer on the substrate. The inert gas is then introduced at a second partial pressure, typically approximately 2.25 Pascal, to create an n type semiconductor layer on the p type semiconductor layer to create a p/n homojunction. This order of introduction may be reversed to create an n/p homojunction. In this embodiment, the substrate is typically heated to 450 degrees Centigrade plus or minus 20 degrees Centigrade. The target is typically cooled to maintain its temperature at 50 degrees Centigrade or less. The power density of the electric field is typically between 1 and 8 Watts per square centimeter of target area.

The inert gas pressure may be varied further to create semiconductor layers of higher or lower resistivity. These layers are called n plus and p plus semiconductor layers. Thus, by sequentially varying the partial pressure of the inert gas in the vacuum chamber, this method allows deposition of a semiconductor homojunction with a plurality of layers of varying conductivity type and resistivity. Typically, the partial pressure can be sequentially varied between approximately one and five Pascal to create a plurality of different semiconductor material layers deposited sequentially on the substrate.

The method of vacuum chamber sputter deposition of a semiconductor homojunction may preferably be employed to deposit copper indium selenide homojunctions with two, three or four layers. The two layer embodiment may be a p/n homojunction. This embodiment is preferably made by first introducing argon gas at a partial pressure of approximately 3 Pascal and second introducing the argon at approximately 2.25 Pascal. The two-layer embodiment may alternatively be an n/p homojunction. This embodiment is preferably made by first introducing argon gas at a partial pressure of approximately 2.25 Pascal and second introducing the argon at approximately 3 Pascal.

A four layer homojunction of this preferred embodiment may be a $p^+/p/n/n^+$ homojunction. This embodiment is preferably made by first introducing argon gas at a partial pressure of between one and five Pascal, second introducing the argon at approximately 3 Pascal, third introducing the argon at approximately 2.25 Pascal, and fourth introducing the argon at between one and five Pascal.

A three layer homojunction pair transistor of this preferred embodiment may be a p/n/p or n/p/n sequential semiconductor homojunction pair transistor. This embodiment may preferably be made by heating the substrate to 450 degrees Centigrade ±20 degrees Centigrade, cooling the target to 50 degrees Centigrade or less, using copper indium selenide for the target material and argon as the inert gas. The power density of the electric field is preferably between 1 and 8 watts per square centimeter of target area. The p-type layers of this embodiment are preferably made by introducing argon gas at a partial pressure of approximately 3 Pascal. The n-type layers are preferably made by introducing argon gas at approximately 2.25 Pascal. The order of introduction is varied according to which three layer homojunction pair is being made.

The method of vacuum chamber sputter deposition of a semiconductor homojunction may further include providing a plurality of targets, each made of a different semiconductor compound, which may be direct bandgap compounds. An electric field is provided between each target and the substrate. In addition, there are means for sequentially selecting each of the targets in turn. This method may be used to deposit sequential semiconductor layers, each of which may be a homojunction, and each of which is made from a different semiconductor material.

The method of vacuum chamber sputter deposition of a semiconductor homojunction may include deposition of semiconductor compounds which are binary, ternary, quaternary, and pentenary. Preferably, the method is used to deposit the ternary semiconductor compound copper indium selenide. The method can also be used to deposit layers of binary compounds, typically including groups $II-VI_2$. The ternary compounds are typically composed of groups $I-III-VI_2$. The quaternary compounds are typically composed of groups $I-III_{1-x}-III_x-VI_2$. The pentenary compounds are typically composed of groups $I-III_{1-x}-III_x-VI_{1-y}-VI_y$.

The method of vacuum chamber sputter deposition of a semiconductor homojunction may be used to produce homojunctions of the types: p/n; n/p/ p/n/nplus; nplus/n/p; pplus/p/n; n/p/pplus; pplus/p/n/nplus; and nplus/n/p/pplus.

A vacuum chamber for sputter deposition of a semiconductor homojunction according to this invention may be accomplished using a vacuum chamber with a cathode which holds a target made of a semiconductor compound containing at least one non-metallic element, an anode for holding a substrate for receiving the sputtered species from the target to form sequential layers of deposited semiconductor material, a power supply electrically connected between the anode and the cathode for creating an electric field which forms inert gas ions, and means for introducing an inert gas into the vacuum chamber sequentially at a plurality of discrete partial pressures.

In operation, the inert gas is ionized by the electric field. The ions then are accelerated toward the target by an induced field. This field may be induced by putting a capacitor in series with the cathode as those well versed in the art of sputtering are aware. These inert gas ions hit the target and knock atoms from it. These sputtered atoms then travel away from the target and deposit on the substrate. By properly controlling the partial pressure of the inert gas, the mean free path of the inert gas ions and the species being sputtered from the target to the substrate can be altered. The mean free path is the average distance an atom can travel before colliding with another atom. These collisions may alter the momentum of the incident and sputtered species. This process is called thermalization. A relatively high partial pressure of inert gas lowers the mean free path, and a relatively low partial pressure of inert gas raises the mean free path. Thus, by properly controlling the momentum of the inert gas ions by balancing the partial pressure of inert gas and the power density of the electric field, the incident energy of the sputtered species can be adjusted, resulting in deposition of semiconductor material layers with varying conductivity types and resistivity.

Typically, the target is kept at 50 degrees Centigrade or less by cathode cooling means to reduce losses of the lighter non-metallic atoms through sublimation or evaporation. The substrate is typically kept at 450 degrees Centigrade plus or minus 20 degrees Centigrade by anode heating and cooling means to provide enough thermal activity to the deposited atoms to ensure proper interatomic bonding. The substrate temperature is kept relatively low to prevent losses of the lighter non-metallic atoms from the surface of the growing layer of deposited semiconductor material. By employing a target made of copper indium selenide and including means for providing the inert gas, typically argon, first at a first partial pressure of approximately 3 Pascai, and second at a second partial pressure of approximately 2.25 Pascal, the vacuum chamber can be used to deposit a copper indium selenide p/n homojunction. Alternatively, by including means for providing the argon first at a first partial pressure of approximately 2.25 Pascal and second at a second partial pressure of approximately 3 Pascal, the vacuum chamber can be used to deposit a copper indium selenide n/p homojunction.

To enhance performance of the vacuum chamber, the means for introducing the inert gas may preferably include a perforated tubular member disposed all around the cathode for introducing the inert gas circumferentially around the target. This means for introducing the inert gas results in more even distribution of gas ions impinging on the surface of the target and a resultant increase in control of the quality of the semiconductor compound deposited on the substrate. Preferably, the target is made of copper indium selenide and the inert gas is argon. The power density of the electric field between the anode and cathode is typically between 1 and 8 Watts per square centimeter of target area.

By varying the partial pressure of the argon in the vacuum chamber, preferably between one and five Pscal, it is possible to control the conductivity type and resistivity of the deposited semiconductor material layers. Layers of copper indium selenide can be created which are p type, n type, n+ type, and p+ type. Thus, by introducing the argon sequentially at a plurality of discrete partial pressures, semiconductor homojunctions with a plurality of different semiconductor material layers can be created.

There is shown in FIG. 1 a block diagram of a method of vacuum chamber sputted deposition of a semiconductor homojunction. The first step 12 is to prepare the target with, for example, stoichiometric quantities of copper, indium and selenium. The second step 14 is to prepare the substrate. Typically, the substrate can be any material which has the required strength, heat resistance characteristics and flatness. Type 304 stainless steel is an example of a suitable substrate material. The third step 16 is to fix the target to the cathode. This is best accomplished by using a heat conductive adhesive to hold the target solidly on the cathode. The fourth step 18 is to fix the substrate to the anode to provide proper heat distribution. Next, the chamber is evacuated at step 20. Typically, the chamber is evacuated to approximately $5 \times 10^{-6}$ Pascal. Next, step 22, the cathode cooling means is employed to cool the target to operating temperature, typically 50 degrees Centigrade or less. The anode is next heated at step 24 to heat the substrate to its operating temperature. Typically, this temperature is 450 degrees Centigrade plus or minus 20 degrees Centigrade. At step 26, the flow of inert gas is started. Typically, this gas is argon and is introduced to the chamber at a partial pressure of between 1 and 5 Pascal. Next, step 28, the electric field is started. This electric field is typically an A/C RF field of between 1 and 8 Watts per square centimeter of target area. The frequency is typically 13.56 MHz to comply with FCC regulations. In operation, the method as described deposits approximately 100 to 200 Angstroms of copper indium selenide per minute. The system can be operated for a number of minutes to deposit the correct amount of semiconductor compound. Next, step 30, the gas pressure is varied to start deposition of a semiconductor compound layer with a different conductivity type or resistivity from the previous layer. Step 30 may be repeated as many times as desired to create a homojunction with a plurality of layers of differing conductivity types and resistivities, or to create multiple, sequential semiconductor layers and homojunctions.

Figure 2:
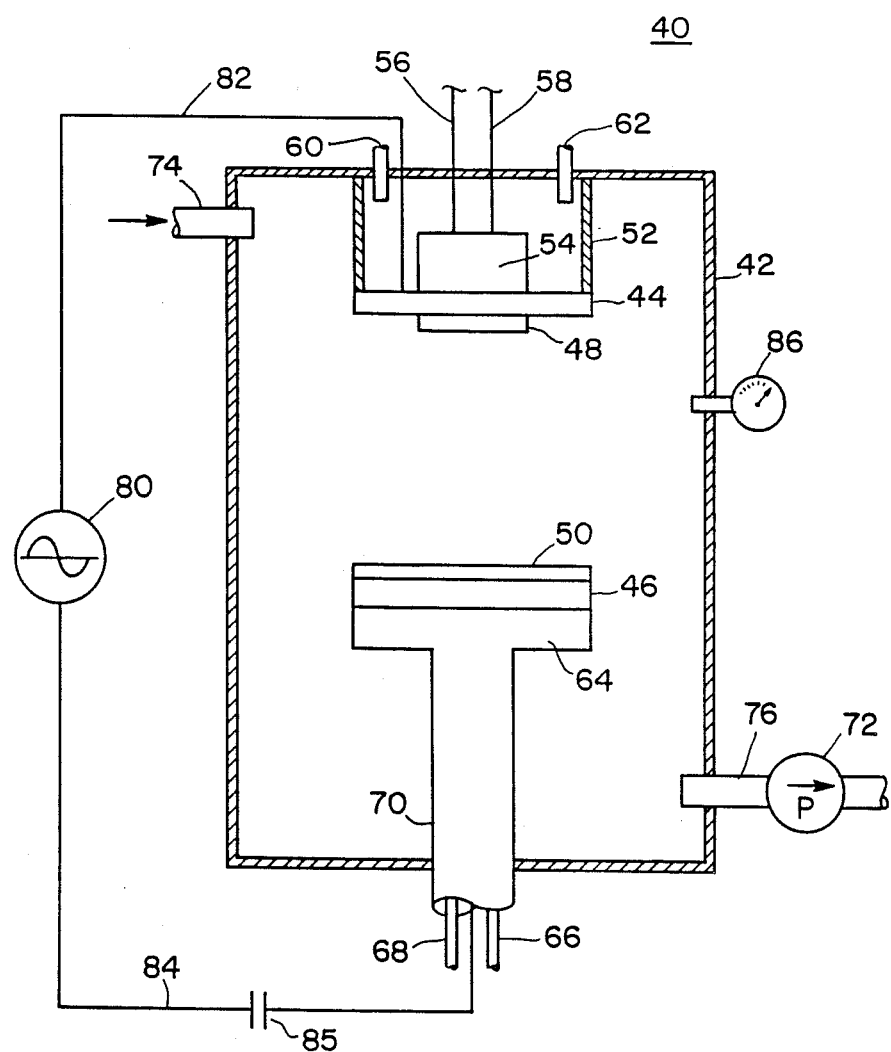
FIG. 2 is a schematic diagram of a vacuum chamber for sputter deposition of a semiconductor homojunction according to this invention.

FIG. 2 shows a vacuum chamber 40 for sputter deposition of a semiconductor homojunction. The vacuum chamber includes vacuum chamber 42 with cathode 46 and anode 44 which may be spaced approximately 5 centimeters apart. Cathode 46 is adapted to hold target 50. Target 50 may be a disk with a diameter of approximately two inches and a thickness of approximately 2 millimeters. The cathode is cooled with water entering through pipe 66 and exiting through pipe 68. These pipes are enclosed in water jacket 70 which includes water spray portion 64 adapted to fit tightly around cathode 46. Anode 44 is adapted to accept target 48.

Cooling jacket 52 is adapted to fit anode 44. Cooling water enters jacket 52 through pipe 60 and leaves through pipe 62. Anode heater 54 is attached to the back of anode 44 and is heated by electricity running through lines 56 and 58.

The means for introducing the inert gas 74 may be a pipe as shown. Pipe 76 and vacuum pump 72 are employed to maintain vacuum and partial pressure of inert gas at the proper level. Further included is electric field generator 80 connected between anode 44 and cathode 46 by means of wires 82 and 84. Capacitor 85 may be placed in series with cathode 46 to induce a field around cathode 46 to accelerate the inert gas ions. Pressure gauge 86 is specially calibrated to accurately read the partial pressure of the inert gas inside vacuum chamber 42.

Figure 3:
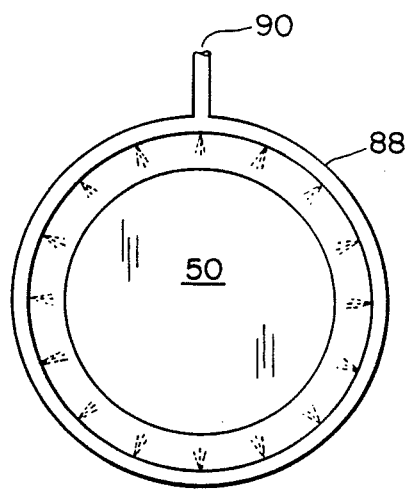
FIG. 3 is a top plan view of the target of FIG. 2 showing an alternative means for introducing an inert gas into the vacuum chamber.

The target 50 and an alternative means of introducing the inert gas is shown in FIG. 3. Pipe 90 is connected to inlet pipe 74, FIG. 2. Pipe 90 ends in annular perforated tubular member 88, perforations not shown. This tubular member is disposed around cathode 46, not shown, and target 50 to introduce the inert gas circumferentially around the cathode and target. In this embodiment, cathode 46, FIG. 2 and target 50 are essentially disk-shaped. Member 88 is an annular tubular member as shown in FIG. 3. This means for introducing the inert gas results in more even distribution of impinging inert gas ions across diameters of target 50.

Figure 4:
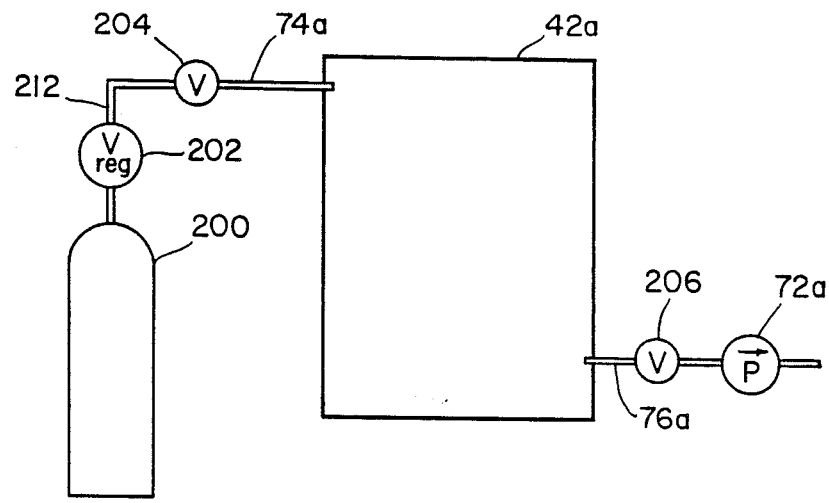
FIG. 4 is a schematic diagram of another alternative means for introducing an inert gas into the vacuum chamber of FIG. 2.

A preferred means for controlling the partial pressures of the inert gas is shown in schematic in FIG. 4. Inert gas enters vacuum chamber 42a through pipe means 74a. Pipe means 74a is supplied by manifold 212, which is attached to pressure tank 200. Manifold 212 includes pressure regulator 202 and variable valve 204 downstream of regulator 202. By manually or electrically controlling valve 204 and regulator 202, the flow rate and pressure of inert gas entering vacuum chamber 42a through pipe means 74a can be closely controlled. Throttle valve 206, pipe means 76a and vacuum pump 72a are employed to evacuate the chamber to the proper starting pressure and to maintain the partial pressure of the inert gas at the proper level.

Figure 5:
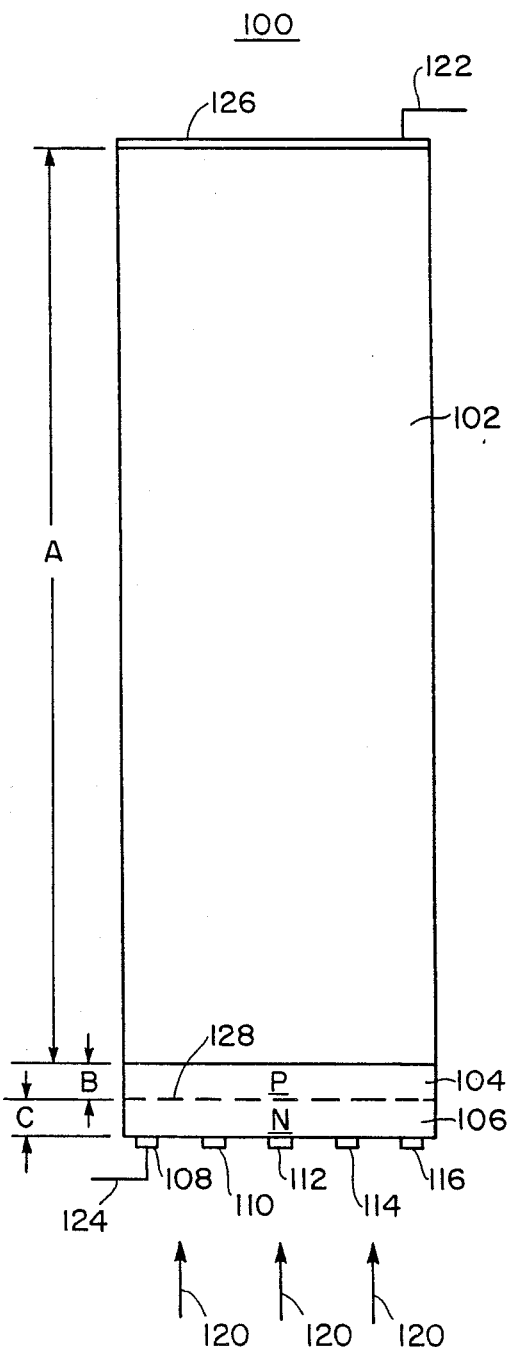
FIG. 5 is a schematic diagram of a prior art PVAS solar cell.
Figure 6:
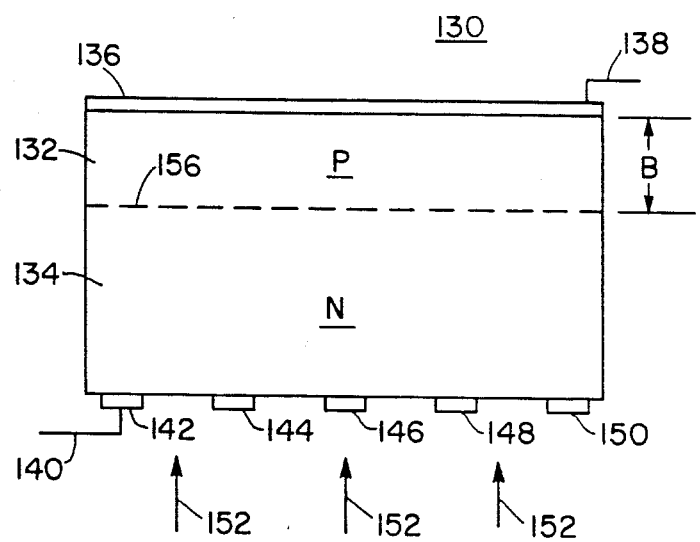
FIG. 6 is a schematic diagram of another prior art PVAS solar cell.

Two prior art semiconductor solar cells are shown in FIGS. 5 and 6. FIG. 5 shows solar cell 100 which is made of a single crystal silicon semiconductor. This semiconductor cell has a base 102 with a thickness A, which is typically approximately 500 microns. The p-type semiconductor, layer 104, is the main photon absorber in a solar cell and has a thickness B of at least 100 microns. Layer 106 of conductivity type n has a thickness C of between 0.1 and 0.5 microns. The p/n boundary 128 is the homojunction of this silicon cell.

Base 102 of cell 100 is provided with electrical contact 126 connected through wire 122 to an external electrical device. The other end of cell 100, the surface of layer 106, is provided with grid contacts such as contacts 108, 110, 112, 114 and 116. These grids are interconnected in a manner not shown and are connected to an external electrical device through wire 124. In operation, sunlight depicted by arrows 120 enters the surface of cell 100, travels through n-type layer 106, and is absorbed in p-type layer 104. Because silicon is an indirect bandgap material, layer p must be relatively thick to absorb most of the incident photons.

FIG. 6 discloses a heterojunction solar cell 130. Cell 130 is made by reactive sputter deposition of p-type copper indium selenide in layer 132, with thickness B of one to two microns. Layer 134 of n-type PVAS is typically n-type cadmium sulfide produced in a separate evaporative deposition system. These reactive sputtering and evaporative deposition systems are typically very expensive.

The n-type cadmium sulfide layer 134 must be relatively thick because thinner material tends to crack and develop shorts across the p/n junction. Thus, when the incident solar rays 152 impinge on the surface of the n-type material and pass through it to be absorbed by the p-type material, up to 20% of the photons are lost by absorption in the thick n-type cadmium sulfide layer 134. Because the photons can only be useful in the p-type layer, this 20% photon loss equates to a 20% loss in solar cell efficiency.

As in the previous figure, the FIG. 6 semiconductor is provided with a contact 136 on the back of the p layer and a wire, 138, connecting this contact to an external electrical device. The other end of the semiconductor is partially covered in a grid network of contacts shown by contacts 142, 144, 146, 148 and 150. This grid network is interconnected by a means, not shown, and is connected to an external electrical device through wire 140.

Figure 7:
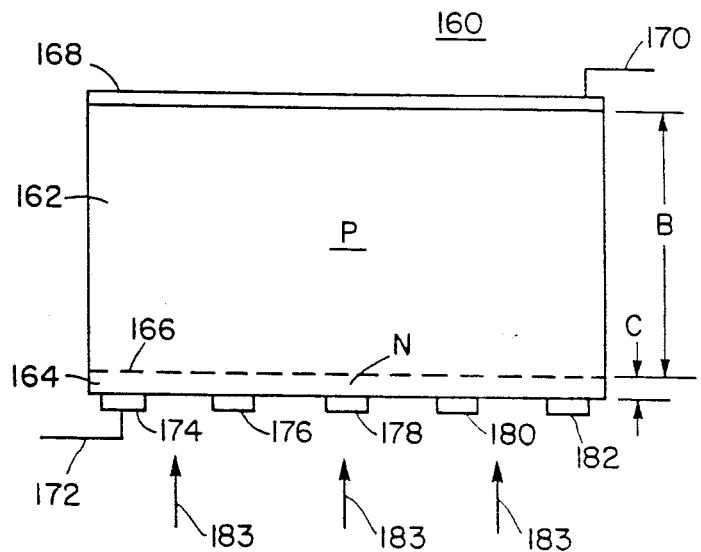
FIG. 7 is a schematic diagram of a thin-film homojunction PVAS solar cell according to this invention.

A typical solar cell homojunction created by a preferred vacuum chamber sputter deposition method of the present invention is shown in FIG. 7. Semiconductor 160 consists of layer 162 of p-type copper indium selenide and layer 164 of n-type copper indium selenide. Layer 162 has a thickness B of approximately one to two microns. Layer 164 has a thickness C of approximately 150 Angstroms. Homojunction 166 is formed at the interface of layers 162 and 164.

Within typical operating parameters of the present invention, solar cell semiconductor 160 is fabricated by operating the vacuum chamber at a first partial pressure of argon of approximately 3 Pascal for approximately 90 minutes to deposit approximately 1.5 microns of p-type copper indium selenide. The partial pressure of argon is then quickly altered to approximately 2.25 Pascal for approximately one minute to deposit approximately 150 Angstroms of n-type copper indium selenide. Contact 168 may be the substrate or may be added to the back of layer 162 after the homojunction is formed. Contact 168 is provided with electrical lead 170. Grid contacts such as contacts 174, 176, 178, 180 and 182 are added to the front face of layer 164 to form a grid which is interconnected in a manner not shown and is provided with wire 172 leading to an external electrical device.

In operation, solar radiation depicted by arrows 183 passes by the electrical contacts, through the extremely thin n-type layer 164, and is absorbed in p-type layer 162. Because layer 164 is extremely thin, transmission losses are minimized. Thus, approximately 95% of the incident photons reach the p-type layer, where many become useful as electron-hole generators.

Alternatively, semiconductor 160 can be used as a light emitting diode structure by supplying DC current over wires 170 and 172. In this application, semiconductor 160 emits light at a characteristic wavelength determined solely by the semiconductor compound chosen for making the target. Thus, a vacuum chamber sputter deposition method of the present invention may be utilized to custom produce light emitting diodes with specifically chosen emission wavelength characteristics.

Figure 8:
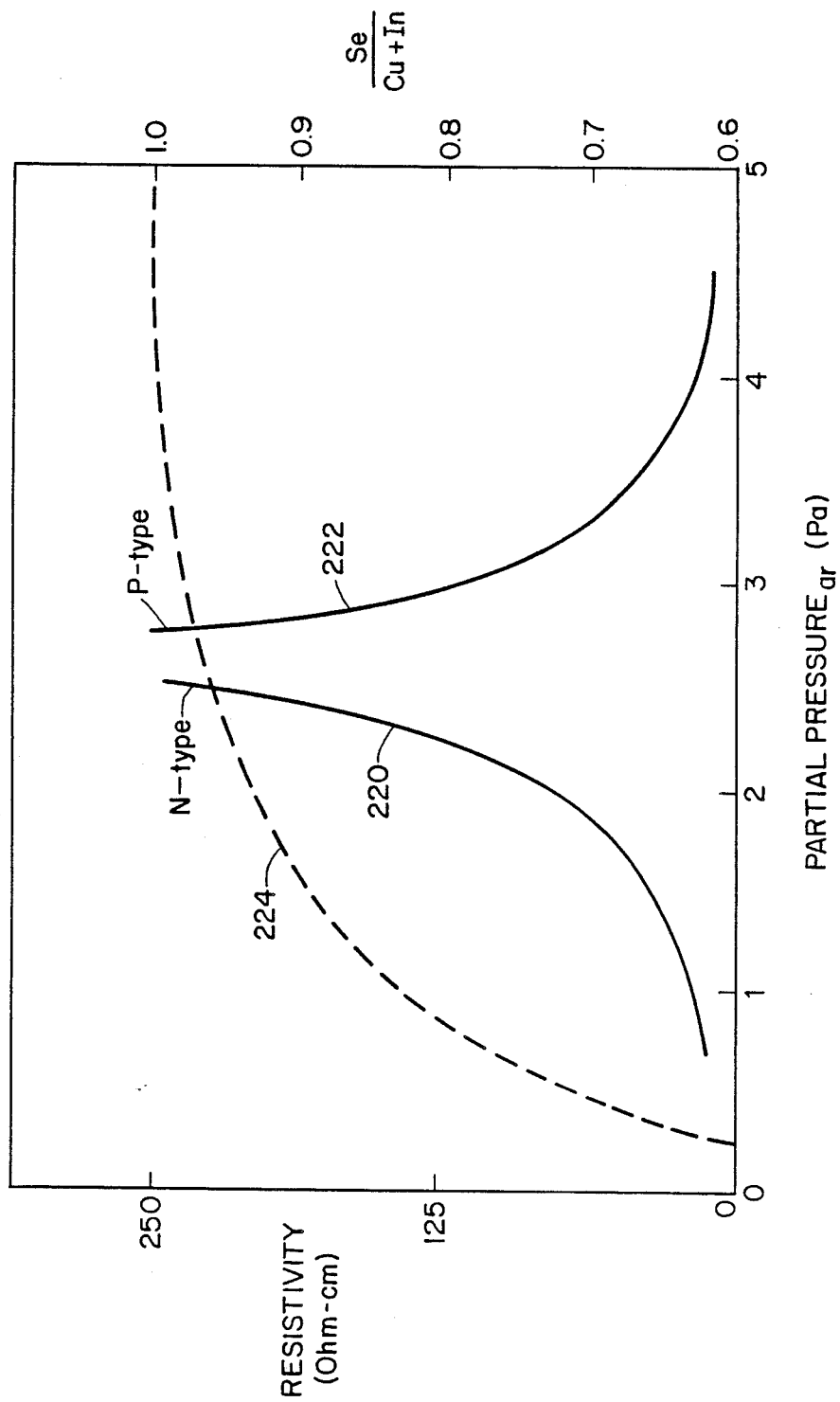
FIG. 8 is a curve illustrating variation of conductivity type, resistivity and non-metal to metals ratio with variation in partial pressure of argon in the vacuum chamber of FIG. 2.

A graph of the approximate relationship of increasing partial pressure of argon to conductivity type, resistivity and ratio of selenium to copper plus indium in a preferred semiconductor deposited by a method of vacuum chamber sputter deposition of the present invention is shown in FIG. 8. Dashed line 224 indicates an approximate relation between partial pressure of argon and the ratio of the number of selenium atoms to the sum of the numbers of copper and indium atoms in the deposited layer. Solid line 220 represents an approximate relationship of resistivity of n-type copper indium selenide to partial pressure of argon. Solid line 222 indicates an approximate relationship of resistivity of p-type copper indium selenide to partial pressure of argon.

The graph of FIG. 8 shows that careful control of the partial pressure of argon in the vacuum chamber sputter deposition system can result in deposition of semiconductor layers of varying conductivity type and resistivity. Thus, by keeping all of the other vacuum chamber parameters constant, slight changes in the partial pressure of argon can be employed to deposit a PVAS with a plurality of conductivity types and resistivities.

Examples of the various types of semiconductor compounds which can be sputter deposited by the method of the present invention to form semiconductor homojunctions is disclosed in FIG. 9. Examples for each of the semiconductor compounds binary, ternary, quaternary and pentenary, are disclosed. The typical group structures shown are meant to be instructive only and are not exhaustive. As is well known in the art, each of these compounds can be composed of a wide variety of group structures.

FIG. 10 indicates typical elements included in the various groups of FIG. 9. Again, this list of elements is instructive and not exhaustive as those well versed in the art are aware. As an example, a preferred embodiment of the present invention results in sputter deposition of a ternary PVAS. This compound, copper indium selenide, is composed of a group I-III-VI$_2$ structure. By looking at FIG. 10, it is evident that the indium could be replaced by, for example, aluminum or gallium. Also, the selenium could be replaced by, for example, tellurium or sulfur. As FIGS. 9 and 10 are merely instructive, the compounds which may be deposited in the sputter deposition system of the present invention are not limited to those disclosed here.

Figure 11:
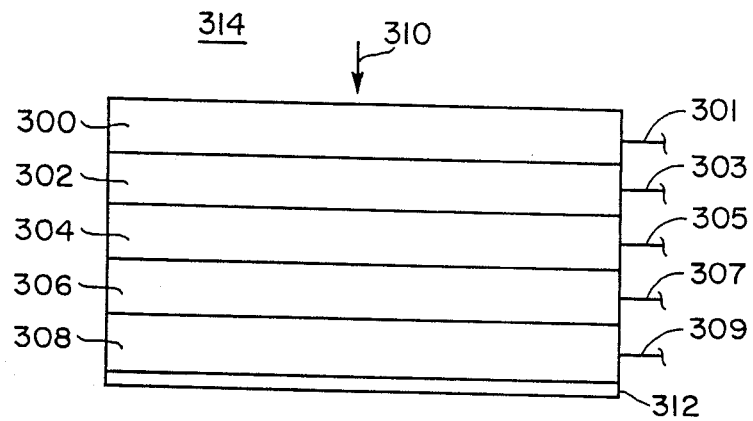
FIG. 11 is a schematic diagram of a multiple layer radiation detector according to this invention.

FIG. 11 shows a multiple layer sequential semiconductor structure for detecting radiation having a characteristic energy level. Semiconductor layers 308, 306, 304, 302 and 300 are sequentially deposited on substrate 312 to form radiation detector 314. Each semiconductor layer is sputtered from a target made of a different direct bandgap semiconductor compound containing at least one non-metallic element. Each semiconductor compound is chosen for its photon absorption at a specific energy level, and each is different from all the other compounds.

Since direct bandgap semiconductor materials absorb incoming radiation (i.e. photons) only at specific energy levels and above, the detector shown in FIG. 11 can be tailored to detect radiation in predetermined energy band levels. For instance, layer 308 could be tailored to absorb photons with energy levels at or above 1.1 Electron Volts (EV). Copper Indium Selenide is an example of a direct bandgap semiconductor compound which absorbs at this energy level.

Thus, the structure of FIG. 11 may be built by depositing a layer of copper indium selenide on substrate 312 to form detector layer 308. Layer 308 may be a homojunction deposited as described above. Layer 306 is then deposited by exchanging a target made of a different semiconductor compound for the copper indium selenide target. Layer 306 may also be a homojunction. This new compound is tailored to absorb at an energy level above 1.1 EV, for instance, 1.2 EV. Since direct bandgap semiconductor compounds absorb essentially all incident photons at or above the compound-specific energy band level and allow most other photons to pass through, new layer 306 will absorb all photons at or above 1.2 EV, and will allow all with energy below 1.2 EV to pass through to layer 308.

By then sequentially depositing layers 304, 302 and 300, for example, each new layer with an energy absorption band level higher than the previous layer's level, a multiple layer structure can be deposited which detects photons in specific energy band level ranges. Each of these layers may also be homojunctions.

By way of illustration, layer 308 could be a 1.1 EV absorber. Layer 306 a 1.2 EV absorber, and layers 304, 302 and 300 could be 1.3, 1.4 and 1.5 EV absorbers, respectively. By providing wires 309, 307, 305, 303, and 301 connected to layers 308, 306, 304, 302, and 300, respectively, each wire also connected to a detector device, not shown, structure 314 can detect energy levels of incident radiation 310 of: 1.5 EV and above, 1.4-1.5 EV, 1.3-1.4 EV, 1.2-1.3 EV, and 1.1-1.2 EV. Thus, a radiation detector for detecting radiation with known energy levels can be fabricated by merely providing a plurality of different targets to form a plurality of sequential semiconductor material layers deposited sequentially on a substrate.

Figure 12:
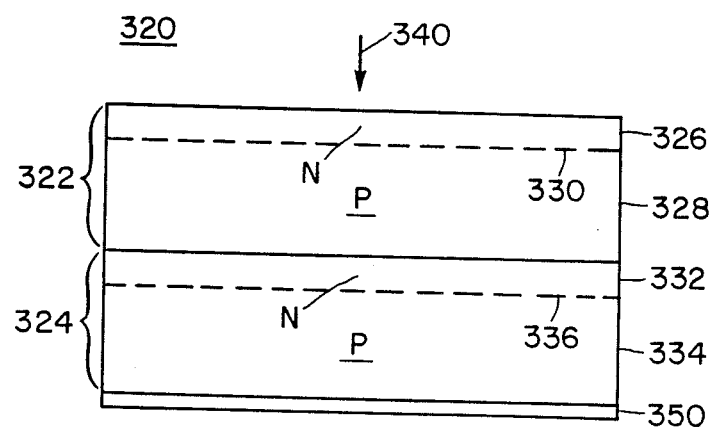
FIG. 12 is a schematic diagram of an enhanced homojunction solar cell structure according to this invention.

FIG. 12 shows a multiple layer sequential semiconductor homojunction structure 320 for an enhanced photovoltaic device. Structure 320 consists of homojunctions 324 and 322 deposited sequentially on substrate 350.

Solar cell structure 320 is made by choosing direct bandga semiconductor compounds with specific energy absorption band level as target materials as described above. For example, layer 324 may be a 1.1 EV absorber and layer 322 a 1.5 EV absorber. Each layer is deposited first as a p type layer, such as layer 334 of layer 324. Next, an n type layer of the same semiconductor compound is deposited, for instance layer 332 of layer 324.

Next, the target is switched to provide a compound with, for instance, an absorption band level of 1.5 EV. P and n type layers 328 and 326, respectively, are sequentially deposited. Electrical contacts and leads, not shown, are then provided to make a complete solar cell.

In operation, light depicted by arrow 340 enters the cell at layer 326. P type layer 328 absorbs photons at energy levels of 1.5 EV and above. Only photons of 1.5 EV are effective as electron-hole producers. The rest of the absorbed photons merely contribute to, for example, vibrational energy of the lattice structure. Photons with energies below 1.5 EV pass through layer 322 and n type layer 332. Photons with energy levels of 1.1 EV to 1.5 EV are absorbed by p type layer 334 and act to create carriers as described above. In this manner, a solar cell with up to n layers can be made to absorb photons at n energy band levels. By choosing direct bandgap semiconductor compounds with absorption levels in the high energy range of the solar spectrum, typically between 1 and 5 EV, a solar cell with greatly increased efficiency can be made by the method of the present invention.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A method of vacuum chamber sputter deposition of a semiconductor homojunction comprising:
   providing a target made of a semiconductor compound containing at least one non-metallic element;
   providing a substrate for receiving the sputtered species from said target to form sequential layers of deposited semiconductor material;
   providing an electric field between said target and said substrate; and
   introducing an inert gas sequentially at a plurality of discrete partial pressures to adjust the incident energy of said sputtered species by thermalization, for altering the mean free path of said sputtered and incident species to control the ratio of non-metallic to metallic elements in said deposited semiconductor material and create a plurality of different semiconductor material layers.

2. The method of claim 1 in which said substrate is heated to 450 degrees Centigrade ±20 degrees Centigrade.

3. The method of claim 1 in which said semiconductor compound is copper indium selenide.

4. The method of claim 1 in which said inert gas is argon.

5. The method of claim 4 in which said argon is first introduced at a first partial pressure of approximately 3 Pascal to create a p type layer and second introduced at a second partial pressure of approximately 2.25 Pascal to create an n type layer.

6. The method of claim 4 in which said argon is introduced at partial pressures of between approximately one and five Pascal to alter the conductivity type and resistivity of said plurality of different semiconductor material layers.

7. The method of claim 4 in which said argon is first introduced at a first partial pressure of approximately 2.25 Pascal to create an n type layer and second introduced at a second partial pressure of approximately 3 Pascal to create a p type layer.

8. The method of claim 1 in which said target is cooled to 50 degrees Centigrade or less.

9. The method of claim 1 in which the power density of said electric field is between 1 and 8 Watts per square centimeter of target area.

10. A p/n homojunction produced by the method of claim 1.

11. An n/p homojunction produced by the method of claim 1.

12. A p/n/nplus homojunction produced by the method of claim 1.

13. An nplus/n/p homojunction produced by the method of claim 1.

14. A pplus/p/n homojunction produced by the method of claim 1.

15. An n/p/pplus homojunction produced by the method of claim 1.

16. A pplus/p/n/nplus homojunction produced by the method of claim 1.

17. An nplus/n/p/pplus homojunction produced by the method of claim 1.

18. The method of claim 1 in which said semiconductor compound is binary.

19. The method of claim 1 in which said semiconductor compound is ternary.

20. The method of claim 1 in which said semiconductor compound is quaternary.

21. The method of claim 1 in which said semiconductor compound is pentenary.

22. The method of claim 1 further including providing a plurality of targets, each said target made of a different semiconductor compound containing at least one non-metallic element and providing an electric field between said substrate and each of said targets, and means for sequentially selecting each of said targets and the associated electric field to sequentially deposit semiconductor material from each said target.

23. The method of claim 1 in which said semiconductor compound is a direct bandgap compound.

24. A method of vacuum chamber sputter deposition of a multiple layer sequential semiconductor homojunction structure comprising:
   providing a plurality of targets, each said target made of a different direct bandgap semiconductor compound containing at least one non-metallic element;
   providing a substrate for sequentially receiving the sputtered species from said targets to form sequential homojunction layers of deposited semiconductor material;
   providing an electric field between said substrate and each of said targets;
   providing means for sequentially selecting each of said targets and the associated electric field; and
   introducing an inert gas sequentially at a multitude of discrete partial pressures to adjust the incident energy of said sputtered species by thermalization, for altering the mean free path of said sputtered and incident species to control the ratio of non-metallic to metallic elements in said deposited semiconductor material and create a plurality of different direct bandgap semiconductor material homojunction layers.

25. A vacuum chamber for sputter deposition of a semiconductor homojunction comprising:
   a vacuum chamber;
   a cathode in said vacuum chamber for holding a target made of a semiconductor compound containing at least one non-metallic element;
   an anode in said vacuum chamber for holding a substrate for receiving the sputtered species from said target to form sequential layers of deposited semiconductor material;
   a power supply electrically connected between said anode and said cathode for creating an electric field to form inert gas ions; and
   means for introducing an inert gas into said vacuum chamber sequentially at a plurality of discrete partial pressures to adjust the incident energy of said sputtered species by thermalization, for altering the mean free path of said sputtered and incident species to control the ratio of non-metallic to metallic elements in said deposited semiconductor material and create a plurality of different semiconductor material layers.

26. The vacuum chamber of claim 25 further including cathode cooling means for maintaining said target at 50 degrees Centigrade or less.

27. The vacuum chamber of claim 25 in which said means for introducing an inert gas includes a perforated tubular member for introducing said inert gas circumferentially around said cathode.

28. The vacuum chamber of claim 25 further including anode heating means for heating said substrate to approximately 450 degrees Centigrade.

29. The vacuum chamber of claim 28 further including anode cooling means for maintaining the temperature of said substrate at approximately 450 degrees Centigrade ±20 degrees Centigrade.

30. The vacuum chamber of claim 25 in which said semiconductor compound is copper indium selenide.

31. The vacuum chamber of claim 30 in which said inert gas is argon.

32. The vacuum chamber of claim 31 in which said means for introducing includes means for providing said argon first at a first partial pressure of approximately 3 Pascal to create a p type layer and second at a second partial pressure of approximately 2.25 Pascal to create an n type layer.

33. The vacuum chamber of claim 31 in which said means for introducing includes means for providing said argon first at a first partial pressure of approximately 2.25 Pascal to create an n type layer and second at a second partial pressure of approximately 3 Pascal to create a p type layer.

34. The vacuum chamber of claim 31 in which said means for introducing includes means for providing said argon sequentially at partial pressures of between approximately one and five Pascal to alter the conductivity type and resistivity of said plurality of different semiconductor material layers.

35. The vacuum chamber of claim 25 in which the power density of said electric field is between 1 and 8 Watts per square centimeter of target area.

36. A method of vacuum chamber sputter deposition of a two layer p/n copper indium selenide homojunction comprising:
provided a target cooled to 50 degrees Centigrade or less and made of copper indium selenide;
providing a substrate kept at 450 degrees Centigrade ±20 degrees Centigrade for receiving the sputtered species from said target to form two layers of deposited semiconductor material;
providing an electric field at a power density of between 1 and 8 Watts per square centimeter of target area between said target and said substrate;
first introducing argon gas at a first partial pressure of between one and five Pascal to adjust the incident energy of said sputtered species by thermalization, for altering the mean free path of said sputtered and incident species to control the ratio of non-metallic to metallic elements in said deposited material and create a p type semiconductor layer; and
second introducing said argon gas at a second partial pressure of between one and five Pascal to adjust the incident energy of said sputtered species by thermalization, for altering the mean free path of said sputtered and incident species to control the ratio of non-metallic to metallic elements in said deposited material and create an n type semiconductor layer to create a p/n copper indium selenide homojunction.

37. The method of claim 36 in which said first partial pressure is approximately 3 Pascal and said second partial pressure is approximately 2.25 Pascal.

38. A method of vacuum chamber sputter deposition of a four layer p/n copper indium selenide homojunction comprising:
providing a target cooled to 50 degrees Centigrade or less and made of copper indium selenide;
providing a substrate kept at 450 degrees Centigrade ±20 degrees Centigrade for receiving the sputtered species from said target to form four layers of deposited semiconductor material;
providing an electric field at a power density of between 1 and 8 Watts per square centimeter of target area between said target and said substrate;
first introducing argon gas at a first partial pressure of between one and five Pascal to adjust the incident energy of said sputtered species by thermalization, for altering the mean free path of said sputtered and incident species to control the ratio of non-metallic to metallic elements in said deposited material and create a p plus type semiconductor layer;
second introducing said argon gas at a second partial pressure of between one and five Pascal to adjust the incident energy of said sputtered species by thermalization, for altering the mean free path of said sputtered and incident species to control the ratio of non-metallic to metallic elements in said deposited material and create a p type semiconductor layer;
third introducing argon gas at a third partial pressure of between one and five Pascal to adjust the incident energy of said sputtered species by thermalization, for altering the mean free path of said sputtered and incident species to control the ratio of non-metallic to metallic elements in said deposited material and create an n type semiconductor layer; and
fourth introducing said argon gas at a fourth partial pressure of between one and five Pascal to adjust the incident energy of said sputtered species by thermalization, for altering the mean free path of said sputtered and incident species to control the ratio of non-metallic to metallic elements in said deposited material and create an n plus type semiconductor layer to create a pplus/p/n/nplus copper indium selenide homojunction.

39. The method of claim 38 in which said second partial pressure is approximately 3 Pascal and said third partial pressure is approximately 2.25 Pascal.

40. A method of vacuum chamber sputter deposition of a three layer sequential semiconductor homojunction pair transistor comprising:
providing a target made of a semiconductor compound containing at least one non-metallic element;
providing a substrate for receiving the sputtered species from said target to form three layers of deposited semiconductor material;
providing an electric field between said target and said substrate;
first introducing an inert gas at a first partial pressure to adjust the incident energy of said sputtered species by thermalization, for altering the mean free path of said sputtered and incident species to control the ratio of non-metallic to metallic elements in said deposited material and create a first layer with a first conductivity type;
second introducing an inert gas at a second partial pressure to adjust the incident energy of said sputtered species by thermalization, for altering the mean free path of said sputtered and incident species to control the ratio of non-metallic to metallic elements in said deposited material and create a second layer with a second conductivity type; and
third introducing an inert gas at a third partial pressure to adjust the incident energy of said sputtered species by thermalization, for altering the mean free path of said sputtered and incident species to control the ratio of non-metallic to metallic elements in said deposited material and create a third layer with said first conductivity type to create a three layer sequential semiconductor homojunction pair transistor.

41. The method of claim 40 in which said substrate is heated to 450 degrees Centigrade ±20 degrees Centigrade.

42. The method of claim 40 in which said target is cooled to 50 degrees Centigrade or less.

43. The method of claim 40 in which said semiconductor compound is copper indium selenide.

44. The method of claim 40 in which said inert gas is argon.

45. The method of claim 44 in which said first and third partial pressures are approximately 3 Pascal and said second partial pressure is approximately 2.25 Pascal to create p/n and n/p sequential homojunction pairs of a p/n/p transistor.

46. The method of claim 44 in which said first and third partial pressures are approximately 2.25 Pascal and said second partial pressure is approximately 3 Pascal to create n/p and p/n sequential homojunction pairs of an n/p/n transistor.

47. The method of claim 40 in which the power density of said electric field is between 1 and 8 Watts per square centimeter of target area.

48. The method of claim 40 in which said first and third partial pressures are approximately equal, to make said first and third layers the same conductivity type, and said second partial pressure is different from said first and third partial pressures to make said second layer a different conductivity type than said first and third layers.

* * * * *